United States Patent
Shen et al.

(10) Patent No.: US 7,379,341 B2
(45) Date of Patent: May 27, 2008

(54) LOADING DATA WITH ERROR DETECTION IN A POWER ON SEQUENCE OF FLASH MEMORY DEVICE

(75) Inventors: Jian-Yuan Shen, Taichung (TW); Chi-Ling Chu, Taichung County (TW); Chou-Ying Yang, Changhua County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 48 days.

(21) Appl. No.: 11/538,844

(22) Filed: Oct. 5, 2006

(65) Prior Publication Data

US 2008/0084756 A1   Apr. 10, 2008

(51) Int. Cl.
    *G11C 11/34*   (2006.01)
    *G11C 7/10*    (2006.01)
    *G11C 7/06*    (2006.01)
(52) U.S. Cl. .......................... 365/185.21; 365/189.05; 365/189.07; 365/190
(58) Field of Classification Search .......... 365/185.21, 365/188.05, 189.07, 190

See application file for complete search history.

(56) References Cited

U.S. PATENT DOCUMENTS

| | | | |
|---|---|---|---|
| 5,784,317 A * | 7/1998 | Ha | 365/185.22 |
| 6,654,272 B2 | 11/2003 | Santin et al. | |
| 6,845,029 B2 | 1/2005 | Santin et al. | |
| 2007/0075869 A1 * | 4/2007 | Vazach et al. | 340/679 |

* cited by examiner

*Primary Examiner*—Ly Duy Pham
(74) *Attorney, Agent, or Firm*—Jianq Chyun IP Office

(57) ABSTRACT

A method of performing a power on sequence for a flash memory includes applying device voltage to the flash memory and loading nonvolatile memory data and nonvolatile memory complementary data to a read data register and a read complementary data register, respectively. The nonvolatile memory data and the nonvolatile memory complementary data are compared with the read data register and the read complementary data register during the power on sequence, e.g., after initial power up or power on reset (POR). When the comparison determines a mismatch, the loading of the nonvolatile memory data and the nonvolatile memory complementary data to the read data register and the read complementary data register, respectively, is repeated.

15 Claims, 8 Drawing Sheets

LOADING DATA WITH ERROR DETECTION IN A POWER ON SEQUENCE OF FLASH MEMORY DEVICE

BACKGROUND OF THE INVENTION

The present invention relates to a power on sequence for a nonvolatile memory semiconductor device, and more particularly, to loading data with error detection during a power on sequence for a flash memory device.

Nonvolatile memory ("NVM") refers to semiconductor memory which is able to continually store information even when the supply of electricity is removed from the device containing such an NVM. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). Flash memory is also a type of NVM which may be considered an EEPROM.

Flash memory cells often use a floating-gate transistor including a source, a drain, a floating-gate layer and a control-gate layer. Access operations are carried out by applying biases to each of these respective terminals. Write operations are generally carried out by channel hot electron injection (CHE). The CHE process induces a flow of electrons between the source and the drain, and accelerates them toward a floating gate in response to a positive bias applied to the control gate. Erase operations are generally carried out through Fowler-Nordheim (FN) tunneling. The erase process may include electrically floating the drain, grounding the source and applying a high negative voltage to the control gate. Read operations generally include sensing a current between the source and the drain in response to a bias applied to the control gate. If the memory cell is programmed, the cell's threshold voltage will be near or above the control-gate bias such that the resulting current is low. If the memory cell is erased, the cell's threshold voltage is well below the control-gate bias such that the current is substantially higher. Other programming, erasing and reading techniques are known in the art.

FIG. 1 shows a basic flash memory device 100 for coupling to a processor or other controller U1. The flash memory device 100 includes a flash array 102, a row decoder 104 and a column decoder 106. The flash array 102 includes a plurality of rows and columns of memory cells accessible for reading, programming and erasing by the combination of the row and column decoders 104, 106. An address buffer 108 is coupled to an address pad 110 for receiving address information and applying the address information to the row and column decoders 104, 106. A sense amplifier 112 senses and amplifies data stored in the individual memory cells within the flash array 102. A data buffer 114 buffers the data received from the sense amplifier 112 and output to a data pad 116. A command control circuit 118 decodes information received from a control pad 120 and a power on reset (POR) pad 122. The command control circuit 118 controls data read, data write and erase operations in the flash memory device 100. Data read from the flash memory array can be selectively written to an information register 124 via a data bus 126.

There are more and more functions in devices containing flash memory which require auto loading of information stored by nonvolatile cells in an information array 102a to the information register 124 during a power on sequence or power-up of the flash memory device 100. The nonvolatile cells of the information array 102a are also within the flash memory device 100, and the information stored therein is typically important for some control functions. The data stored in the nonvolatile cells of the information array 102a can be programmed, erased and read by using the same data path as the rest of a normal flash array 102.

FIG. 2 is a graph depicting device voltage versus time for a conventional power on sequence of a flash memory array 102. As shown, when the device voltage reaches the minimum logic low value, e.g., 1.8 V, POR (power on reset) goes low and an immediate read of data from the memory array 102 may not be stable because either the device voltage is too low to read information array or the device voltage is influenced by noise. During the power on sequence, the flash memory device 100 is typically not ready for normal function yet. For example, the device voltage may fluctuate before it reaches 3.0 V. If the device voltage is not ready, reading information stored by nonvolatility cell may be not stable.

It is desirable to provide a power on sequence for a nonvolatile memory semiconductor device. It is also desirable to provide power on sequence for a flash memory device that includes error detection in reading data. It is desirable to ensure that accurate data is loaded during a power on sequence of a flash memory device by loading data and performing data comparison during the power on sequence in proceeding with loading more data.

BRIEF SUMMARY OF THE INVENTION

Briefly stated, an embodiment of the present invention comprises a method of performing a power on sequence for a flash memory that includes applying device voltage to the flash memory and loading nonvolatile memory data and nonvolatile memory complementary data to a read data register and a read complementary data register, respectively. The nonvolatile memory data and the nonvolatile memory complementary data are compared with the read data register and the read complementary data register during the power on sequence, e.g., after initial power up or power on reset (POR). When the comparison determines a mismatch, the loading of the nonvolatile memory data and the nonvolatile memory complementary data to the read data register and the read complementary data register, respectively, is repeated.

Another embodiment of the present invention comprises a method of performing a power on sequence for a flash memory that includes applying device voltage to the flash memory, loading nonvolatile memory data to a read data register and loading nonvolatile memory complementary data to a read complementary data register. The read data register is compared with the read complementary data register during the power on sequence, e.g., after initial power up or POR. When the comparison determines a mismatch, the loading of the nonvolatile memory data to the read data register is repeated and the loading of the nonvolatile memory complementary data to the read complementary data register is repeated.

Another embodiment of the present invention comprises a method of performing a power on sequence for a flash memory that includes applying device voltage to the flash memory, loading nonvolatile memory data to a set of read data registers and loading nonvolatile memory complementary data to a set of read complementary data registers. The read data registers are compared with the read complementary data registers during the power on sequence, e.g., after initial power up or POR. When the comparison determines a mismatch, the loading of the nonvolatile memory data to the set of read data registers is repeated and the loading of the nonvolatile memory complementary data to the set of read complementary data registers is repeated.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
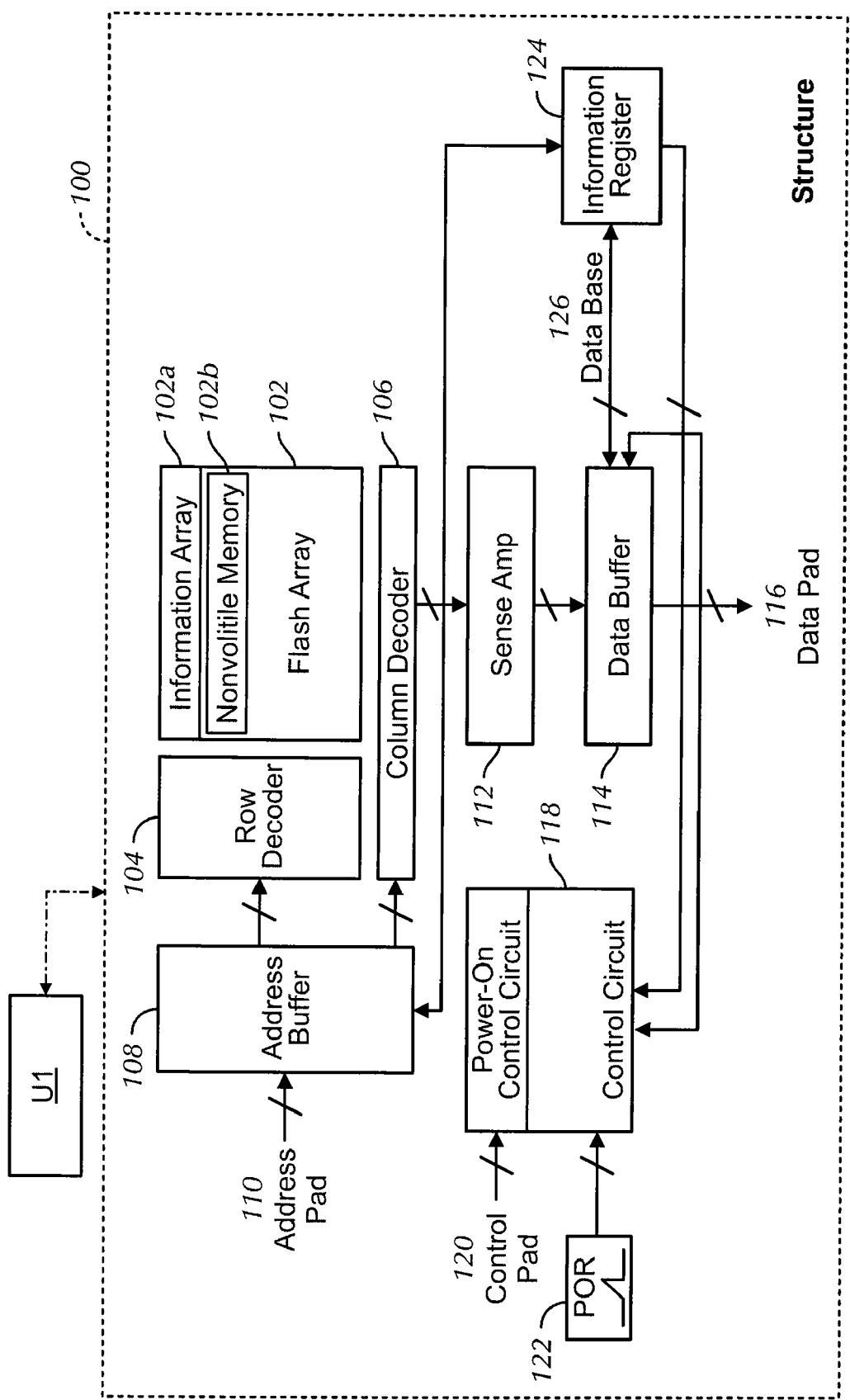
FIG. 1 is a functional block diagram of a basic conventional flash memory device for coupling to a processor.

Certain terminology is used in the following description for convenience only and is not limiting. The words "right", "left", "lower", and "upper" designate directions in the drawing to which reference is made. The words "inwardly" and "outwardly" refer to directions toward and away from, respectively, the geometric center of the object described and designated parts thereof. The terminology includes the words above specifically mentioned, derivatives thereof and words of similar import. Additionally, the words "a" and "an," as used in the claims and in the corresponding portions of the specification, mean "at least one."

Figure 3:
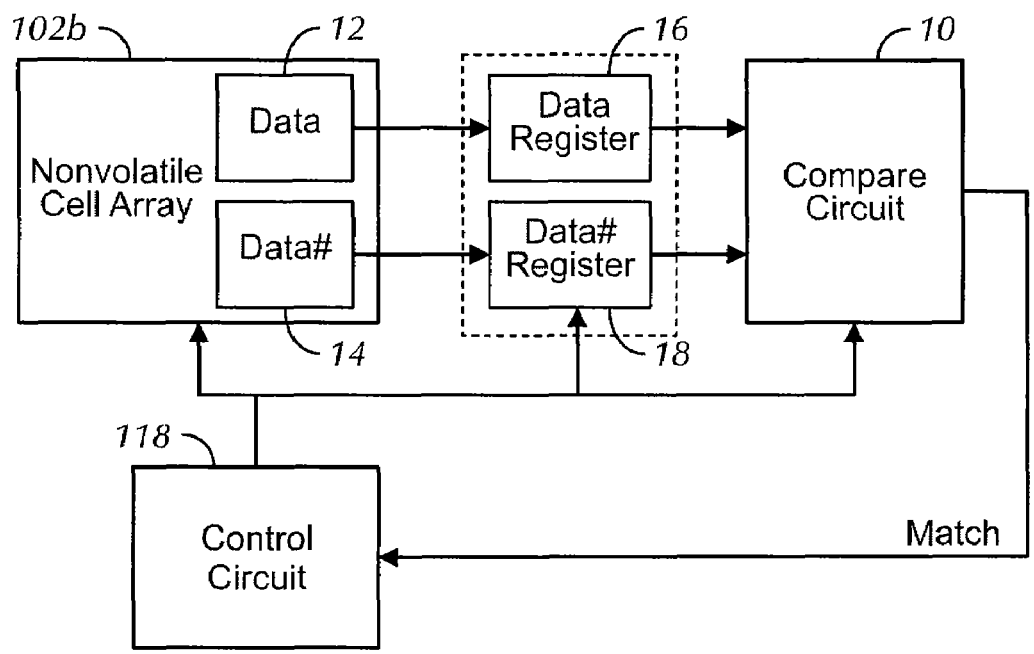
FIG. 3 is a schematic diagram showing a compare circuit for a flash memory device in accordance with a preferred embodiment of the present invention.

Referring to the drawings in detail where like element numbers reference like elements throughout, FIG. 3 shows a compare circuit 10 for a flash memory device 100 in accordance with a preferred embodiment of the present invention. A nonvolatile cell array 102b stores a plurality of nonvolatile memory data registers 12 and nonvolatile memory complementary data registers 14, wherein the complement for DATA is depicted as "DATA#" in the drawings. The nonvolatile memory data 12 and the nonvolatile memory complementary data 14 are loaded to data register 16 and complementary data register 18, respectively. The loading of the nonvolatile memory data 12 and the nonvolatile memory complementary data 14 to the read data register 16 and the read complementary data register 18 may be performed simultaneously or separately. The nonvolatile memory data 12 and the nonvolatile memory complementary data 14 are then compared, during a power on sequence 20 (FIG. 4), e.g., after initial power up or power on reset (POR), with the read data 16 and the read complementary data 18, respectively, using the compare circuit 10. If the comparison is a match, the compare circuit 10 signals the control circuit 118 to proceed with loading the next set of nonvolatile memory data 12 and nonvolatile memory complementary data 14 to the next set of data register 16 and complementary data register 18. If the comparison does not match, the control circuit 118 will load and the compare circuit 10 will compare the same nonvolatile memory data 12 and nonvolatile memory complementary data 14 again.

The comparison circuit 10 may be configured to compare all of the nonvolatile memory data 12, the nonvolatile memory complementary data 14, the read data 16 and the read complementary data 18 in order to determine a match or mismatch. For example, if the nonvolatile memory data 12 and the read data 16 match and/or the nonvolatile memory complementary data 14 and the read complementary data 18 match, there is a match. But, if either the nonvolatile memory data 12 and the read data 16 do not match or the nonvolatile memory complementary data 14 and the read complementary data 18 do not match, there is a mismatch. The comparison circuit 10 may also include additional error checking and data confirmation/comparison logic.

Alternately, the comparison circuit 10 may be configured to compare only the read data 16 and the read complementary data 18 in order to determine a match or mismatch. For example, if the read data 16 and the read complementary data 18 are complementary, there is a match, but if the read data 16 and the read complementary data 18 are not complementary, there is a mismatch. The comparison circuit 10 may also include additional error checking and data confirmation/comparison logic. Preferably, the comparison is made by comparing only the read data and the read complementary data 18. Optionally, only a part of the data may be compared, such as 8 or 16 bits out of 16 or 32 bits or more. It is also contemplated that the complementary data register 18 may be used only for comparing data and data register 16 may be used only to form the device condition.

Figure 13:
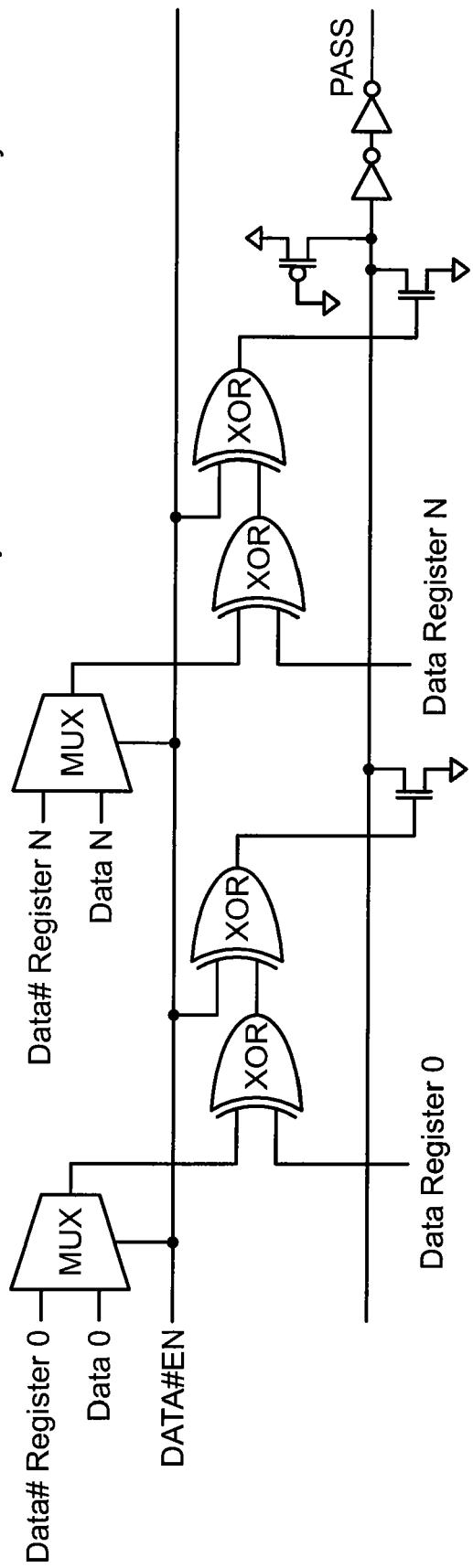
FIG. 13 is a schematic diagram of one possible detailed implementation of a comparison circuit in accordance with the preferred embodiments of the present invention.

The comparison circuit 10 may be implemented with known comparison circuitry such as comparators, digital logic or the like. FIG. 13 depicts one possible detailed implementation of a comparison circuit 10 which uses data multiplexers (MUX) and exclusive OR gates (XOR) to make the comparisons.

Figure 4:
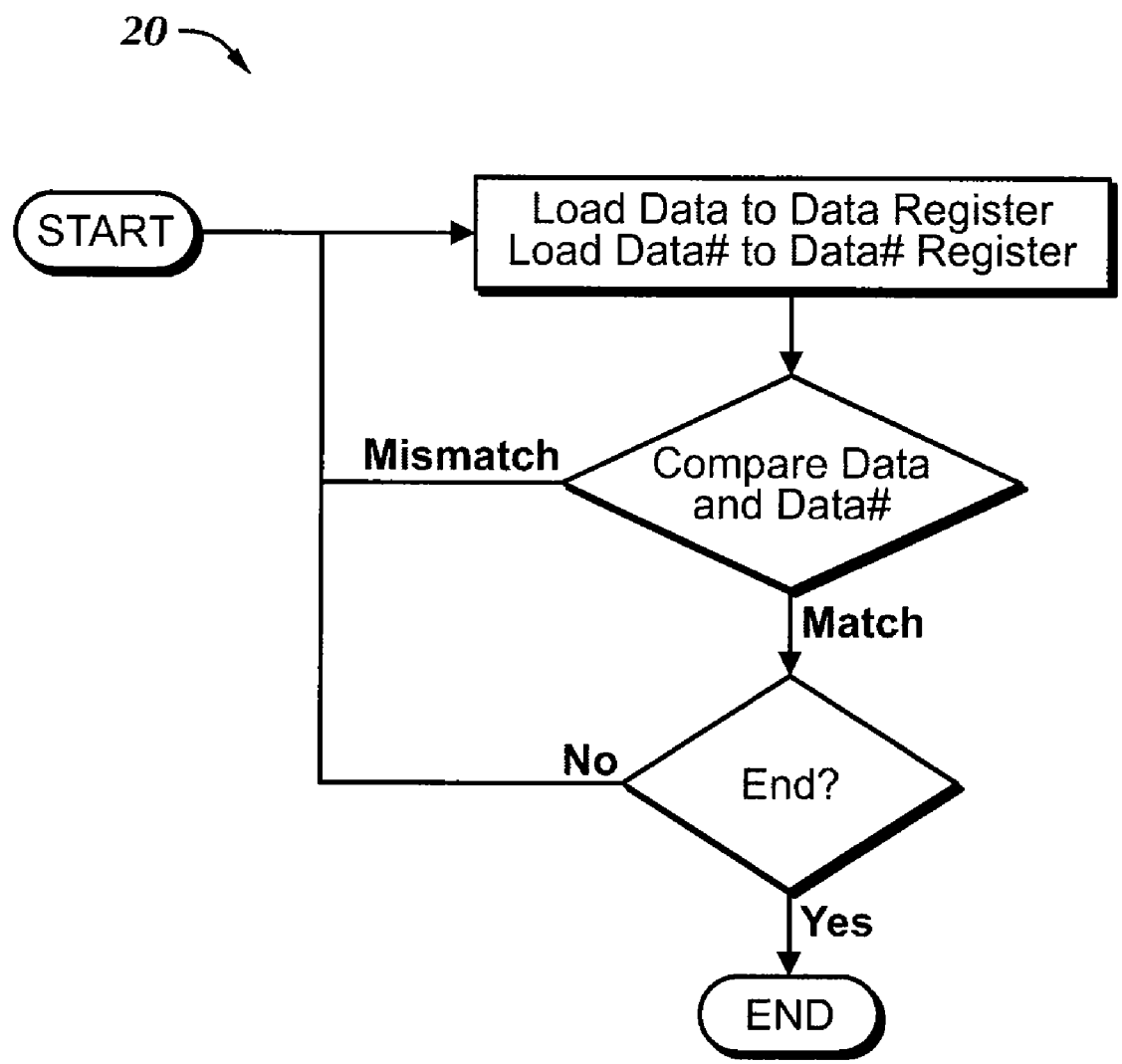
FIG. 4 is a flow chart of a power on sequence for a memory device that includes loading data with error detection in accordance with a first preferred embodiment of the present invention.

FIG. 4 shows a flow chart of the power on sequence 20 for a flash memory device 100 in accordance with a first preferred embodiment of the present invention. The method of performing the power on sequence 20 for the flash memory device 100 includes applying device voltage to the flash memory 100, loading nonvolatile memory data 12 and nonvolatile memory complementary data 14 to a read data register 16 and a read complementary data register 18, respectively. The read data register 16 and the read complementary data register 18 are compared during the power on sequence, e.g., after initial power up or POR. When the comparison determines a mismatch, the loading of the nonvolatile memory data 12 and the nonvolatile memory complementary data 14 to the read data register 16 and the read complementary data register 18, respectively, is repeated. When the comparison determines a match, a next set of nonvolatile memory data 12 and nonvolatile memory complementary data 14 is loaded to the read data register 16 and the read complementary data register 18, respectively. The power on sequence 20 may continue until all the nonvolatile memory data 12 and the nonvolatile memory complementary data 14 have been loaded and verified. Alternately, the power on sequence 20 may only run until the device voltage reaches a normal level or a nearly normal level. Alternately, the power on sequence 20 may run a predetermined number of times or for a predetermined number of clock cycles or a predetermined period of time.

Figure 11:
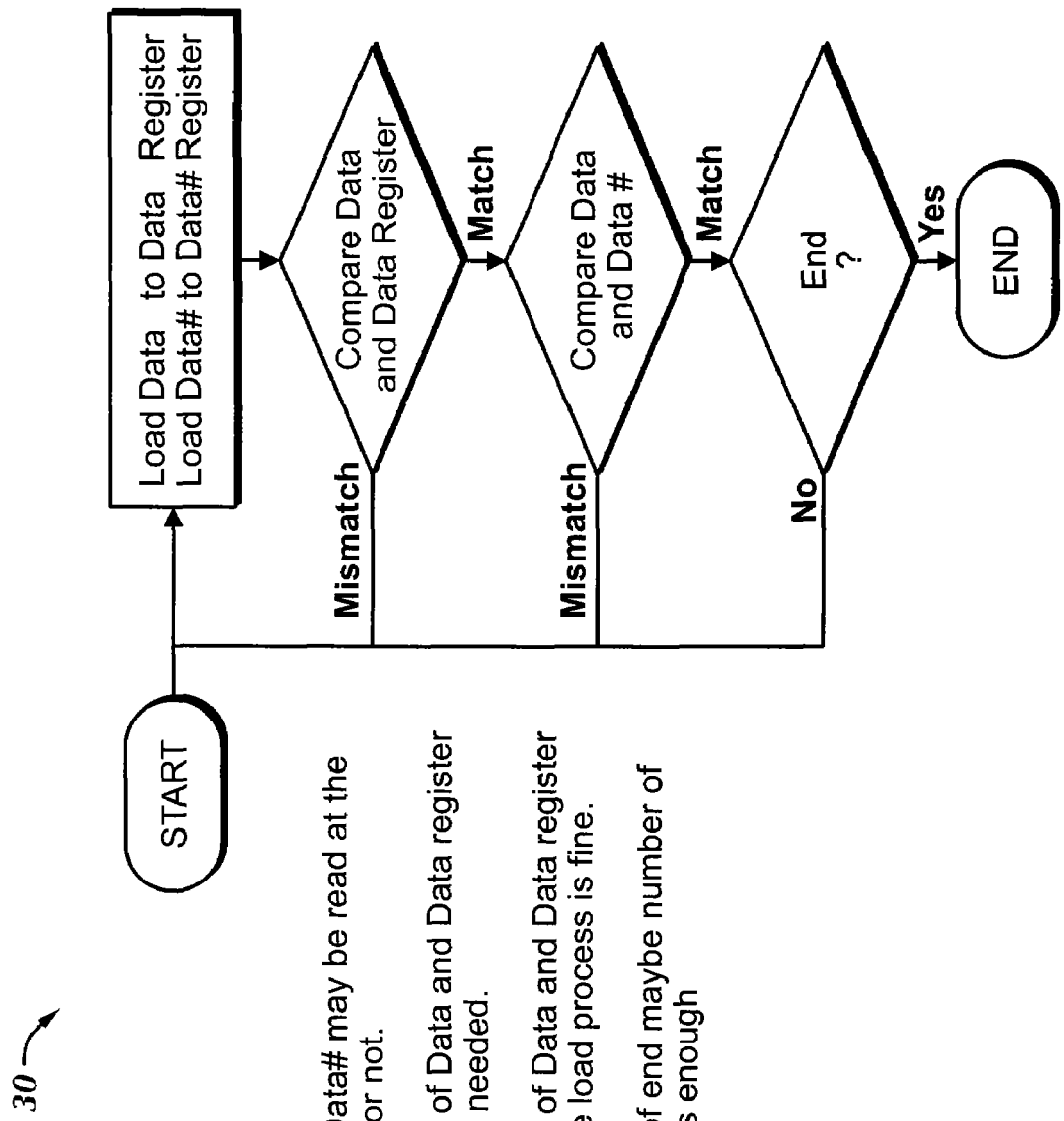
FIG. 11 is a flow chart of a power on sequence for a memory device that includes loading data with error detection in accordance with a second preferred embodiment of the present invention.

FIG. 11 is a flow chart of a power on sequence for a memory device that includes loading data with error detection in accordance with a second preferred embodiment of the present invention. The method of performing the power on sequence 30 for the flash memory device 100 includes applying device voltage to the flash memory 100, loading nonvolatile memory data 12 and nonvolatile memory complementary data 14 to a read data register 16 and a read complementary data register 18, respectively. The nonvolatile memory data 12 and the nonvolatile memory complementary data 14 are compared with the read data register 16 and the read complementary data register 18 during the power on sequence, e.g., after initial power up or POR. When the comparison determines a mismatch, the loading of the nonvolatile memory data 12 and the nonvolatile memory complementary data 14 to the read data register 16 and the read complementary data register 18, respectively, is repeated. When the comparison determines a match, a next set of nonvolatile memory data 12 and nonvolatile memory complementary data 14 is loaded to the read data register 16 and the read complementary data register 18, respectively. The power on sequence 30 may continue until all the nonvolatile memory data 12 and the nonvolatile memory complementary data 14 have been loaded and verified. Alternately, the power on sequence 30 may only run until the device voltage reaches a normal level or a nearly normal level. Alternately, the power on sequence 30 may run a predetermined number of times or for a predetermined number of clock cycles or a predetermined period of time.

Figure 12:
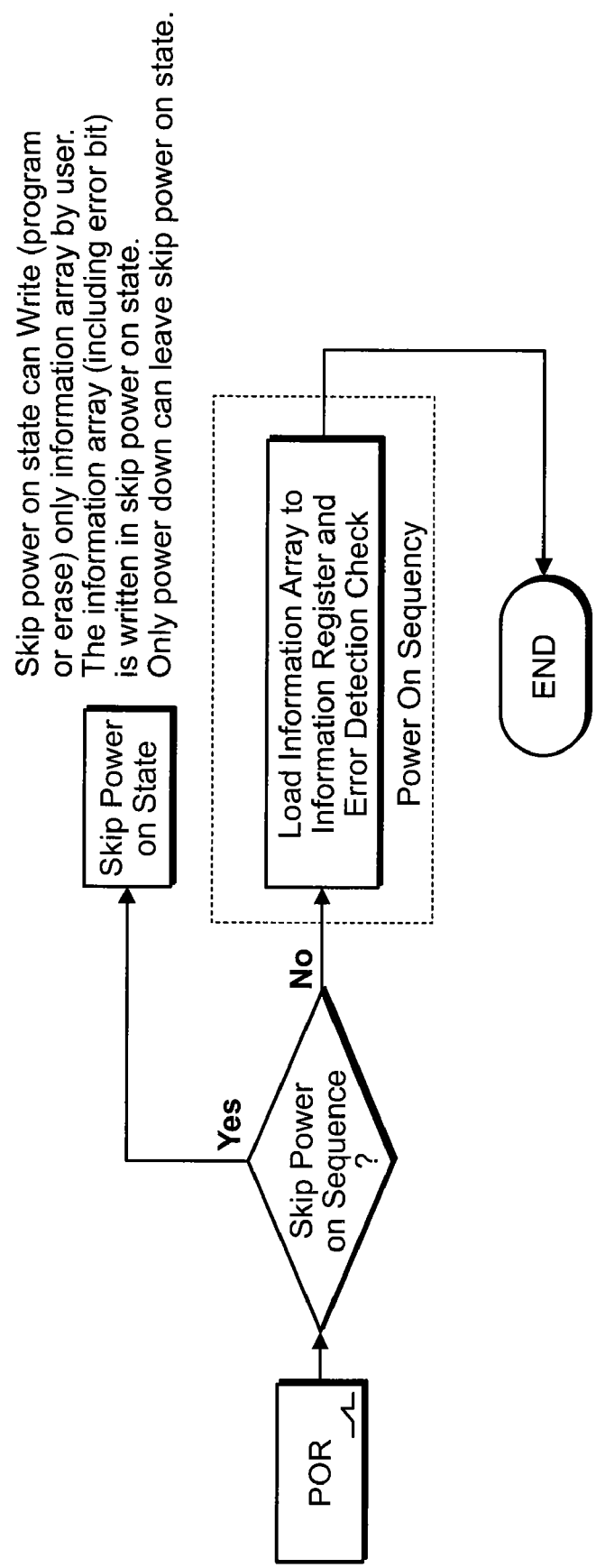
FIG. 12 is a flow chart of a power on sequence for a memory device being optionally selectable in accordance with the preferred embodiments of the present invention.

FIG. 12 is a flow chart of a power on sequence for a memory device being optionally selectable in accordance with the preferred embodiments of the present invention. If the "skip power on sequence" is selected, the information array is written without data error checking.

Figure 2:
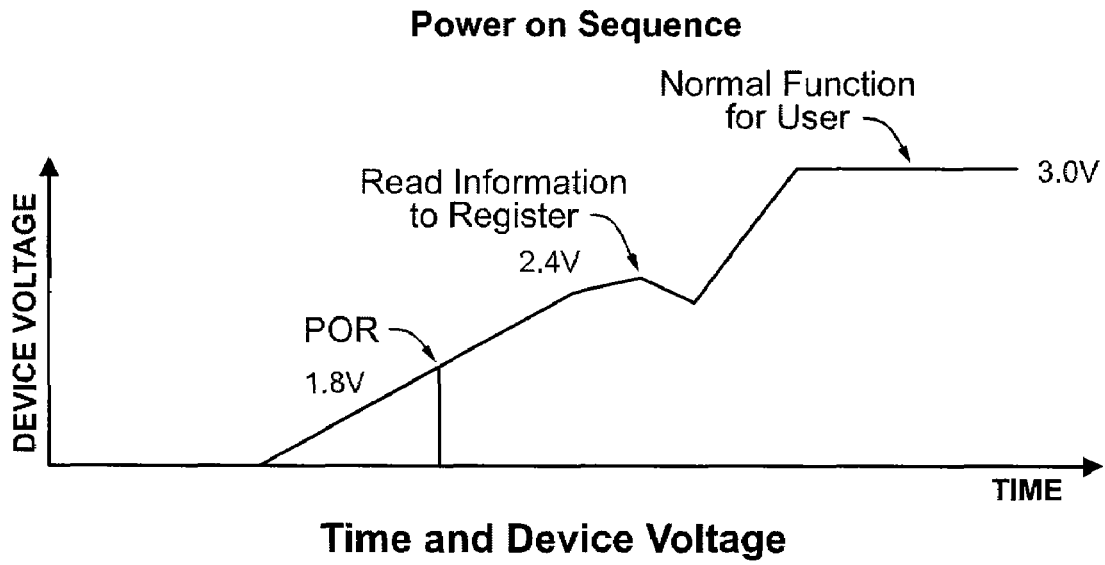
FIG. 2 is a graph depicting device voltage versus time of a conventional power on sequence for a flash memory device.

Referring to FIG. 2, the power on sequence is preferably performed after the device voltage reaches a predetermined minimum voltage. POR (power on reset) signal will go low when device voltage reaches the predetermined minimum value but the predetermined voltage maybe not high enough for read array including information array data. For example, the predetermined voltage may be about 1.8 V and the read voltage may be about 2.6 V. The predetermined minimum voltage and the read low voltage may be other values.

FIGS. 5-10 show exemplary comparisons of the nonvolatile memory data 12 and the nonvolatile memory complementary data 14 with the read data register 16 and the read complementary data register 18, respectively.

Figure 5:
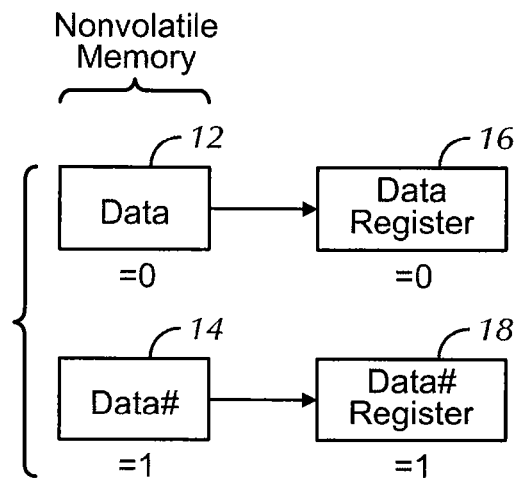
FIGS. 5-10 show a comparison of nonvolatile memory data and nonvolatile memory complementary data with read data register and read complementary data register, respectively.

In FIG. 5, the nonvolatile memory data 12 is logic "0," the nonvolatile memory complementary data 14 is logic "1," the read data register 16 is logic "0" and the read complementary data register 18 is logic "1." Therefore, the read of the read data register 16 and the read complementary data register 18 match, i.e., they are proper complements, so the control circuit 118 is signaled by the compare circuit 10 to proceed with loading the next set of nonvolatile memory data 12 and nonvolatile memory complementary data 14 to the read data register 16 and the read complementary data register 18, respectively.

Figure 6:
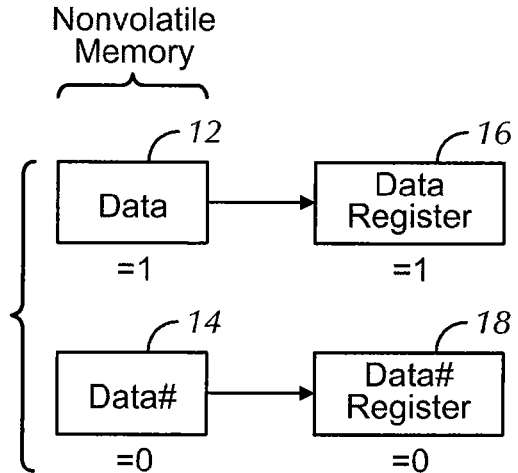

Likewise in FIG. 6, the nonvolatile memory data 12 is logic "1," the nonvolatile memory complementary data 14 is logic "0," the read data register 16 is logic "1" and the read complementary data register 18 is logic "0." Therefore, the read of the read data register 16 and the read complementary data register 18 match, i.e., they are proper complements, so the control circuit 118 is signaled by the compare circuit 10 to proceed with loading the next set of nonvolatile memory data 12 and nonvolatile memory complementary data 14 to the read data register 16 and the read complementary data register 18, respectively.

Figure 7:
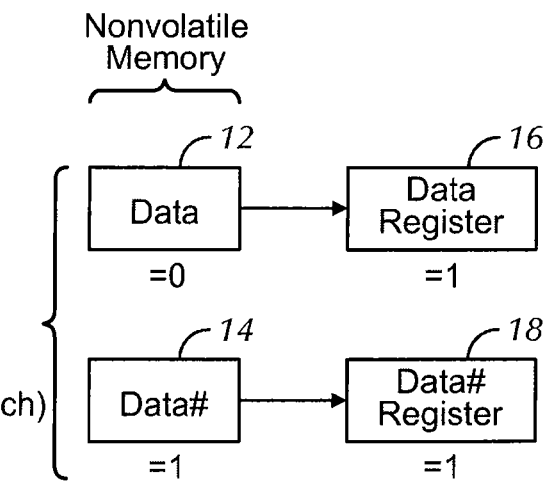

In FIG. 7, the nonvolatile memory data 12 is logic "0," the nonvolatile memory complementary data 14 is logic "1," the read data register 16 is logic "1" and the read complementary data register 18 is logic "1." Therefore, the read of the read data register 16 and the read complementary data register 18 do not match (mismatch), i.e., they are not proper complements, so the control circuit 118 is signaled by the compare circuit 10 to repeat the loading of the nonvolatile memory data 12 and nonvolatile memory complementary data 14 to the read data register 16 and the read complementary data register 18, respectively. The comparison is then performed again until there is a match as shown in the sequence 20 of FIG. 4.

Figure 8:
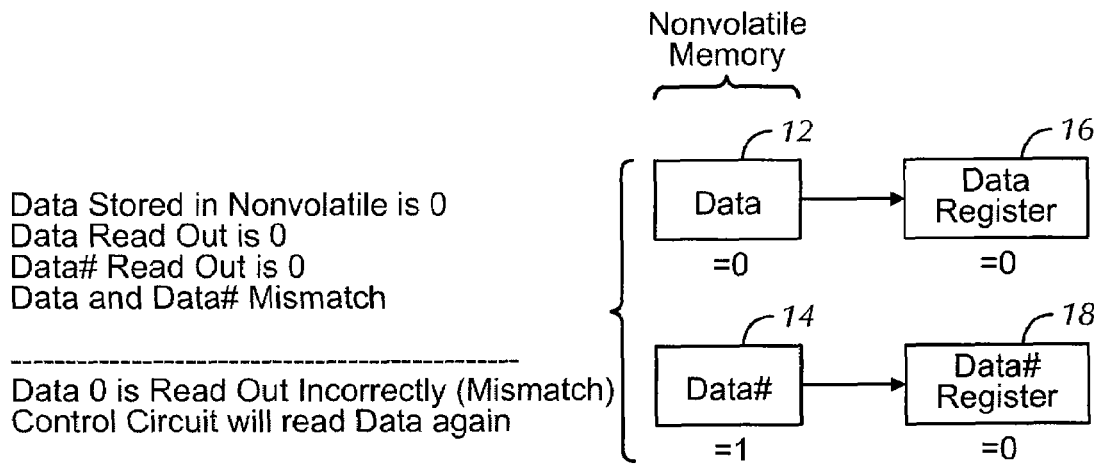

Similarly, in FIG. 8, the nonvolatile memory data 12 is logic "0," the nonvolatile memory complementary data 14 is logic "1," the read data register 16 is logic "0" and the read complementary data register 18 is logic "0." Therefore, the read of the read data register 16 and the read complementary data register 18 do not match (mismatch), i.e., they are not proper complements, so the control circuit 118 is signaled by the compare circuit 10 to repeat the loading of the nonvolatile memory data 12 and nonvolatile memory complementary data 14 to the read data register 16 and the read complementary data register 18, respectively. The comparison is then performed again until there is a match as shown in the sequence 20 of FIG. 4.

Figure 9:
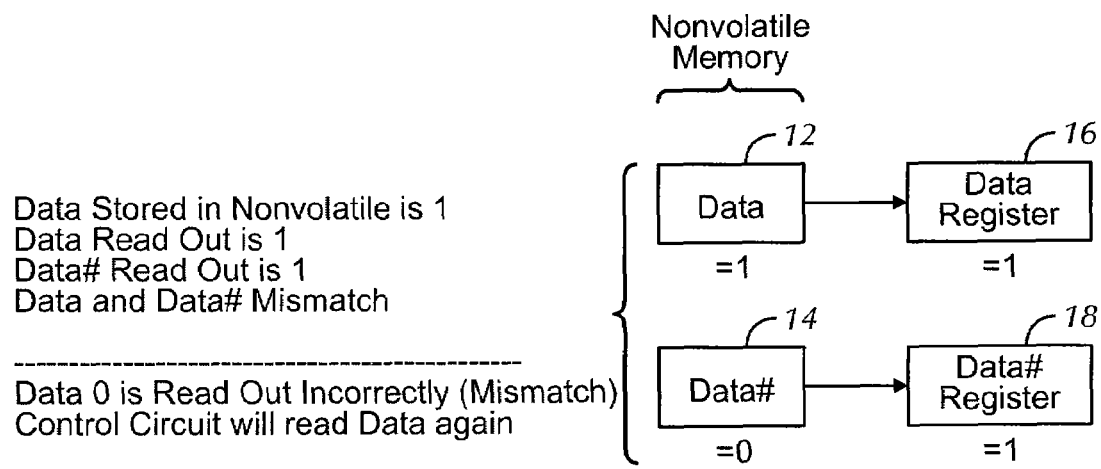

Likewise, in FIG. 9, the nonvolatile memory data 12 is logic "1," the nonvolatile memory complementary data 14 is logic "0," the read data register 16 is logic "1" and the read complementary data register 18 is logic "1." Therefore, the read of the read data register 16 and the read complementary data register 18 do not match (mismatch), i.e., they are not proper complements, so the control circuit 118 is signaled by the compare circuit 10 to repeat the loading of the nonvolatile memory data 12 and nonvolatile memory complementary data 14 to the read data register 16 and the read complementary data register 18, respectively. The comparison is then performed again until there is a match as shown in the sequence 20 of FIG. 4.

Figure 10:
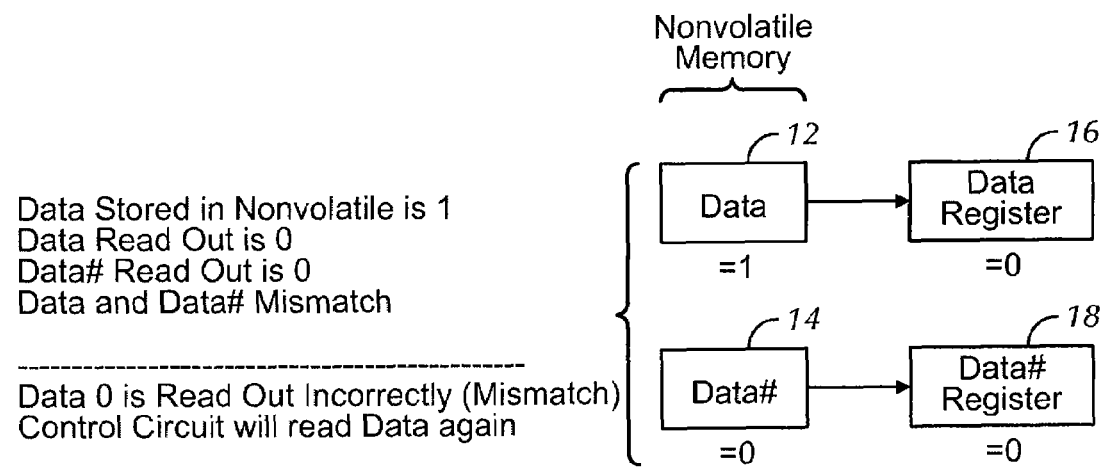

Similarly, in FIG. 10, the nonvolatile memory data 12 is logic "1," the nonvolatile memory complementary data 14 is logic "0," the read data register 16 is logic "0" and the read complementary data register 18 is logic "0." Therefore, the read of the read data register 16 and the read complementary data register 18 do not match (mismatch), i.e., they are not proper complements, so the control circuit 118 is signaled by the compare circuit 10 to repeat the loading of the nonvolatile memory data 12 and nonvolatile memory complementary data 14 to the read data register 16 and the read complementary data register 18, respectively. The comparison is then performed again until there is a match as shown in the sequence 20 of FIG. 4.

From the foregoing, it can be seen that the present invention comprises a power on sequence for a flash memory device that includes loading data and performing data comparison during the power on sequence before proceeding with loading more data. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of performing a power on sequence for a flash memory, the method comprising:
   applying device voltage to the flash memory;
   loading nonvolatile memory data and nonvolatile memory complementary data to a read data register and a read complementary data register, respectively;
   comparing the nonvolatile memory data and the nonvolatile memory complementary data with the read data register and the read complementary data register during the power on sequence; and
   when the comparison determines a mismatch, repeating the loading of the nonvolatile memory data and the nonvolatile memory complementary data to the read data register and the read complementary data register, respectively.

2. The method according to claim 1, further comprising:
   when the comparison determines a match, loading a next set of nonvolatile memory data and nonvolatile memory complementary data to the read data register and the read complementary data register, respectively.

3. The method according to claim 1, wherein the power on sequence is performed after the device voltage reaches a predetermined minimum voltage.

4. The method according to claim 1, wherein the loading of the nonvolatile memory data and the nonvolatile memory complementary data to the read data register and the read complementary data register is performed simultaneously.

5. The method according to claim 1, wherein the loading of the nonvolatile memory data and the nonvolatile memory complementary data to the read data register and the read complementary data register is performed separately.

6. A method of performing a power on sequence for a flash memory, the method comprising:
   applying device voltage to the flash memory;
   loading nonvolatile memory data to a read data register;
   loading nonvolatile memory complementary data to a read complementary data register;
   comparing the read data register with the read complementary data register during the power on sequence; and
   when the comparison determines a mismatch, repeating the loading of the nonvolatile memory data to the read data register and repeating the loading of the nonvolatile memory complementary data to the read complementary data register.

7. The method according to claim 6, further comprising:
   when the comparison determines a match, loading a next set of nonvolatile memory data to the read data register and loading a next set of nonvolatile memory complementary data to the read complementary data register.

8. The method according to claim 6, wherein the power on sequence is performed after the device voltage reaches a predetermined minimum voltage.

9. The method according to claim 6, wherein the loading of the nonvolatile memory data to the read data register and the loading of the nonvolatile memory complementary data to the read complementary data register is performed simultaneously.

10. The method according to claim 6, wherein the loading of the nonvolatile memory data to the read data register and the loading of the nonvolatile memory complementary data to the read complementary data register is performed separately.

11. A method of performing a power on sequence for a flash memory, the method comprising:
    applying device voltage to the flash memory;
    loading nonvolatile memory data to a set of read data registers;
    loading nonvolatile memory complementary data to a set of read complementary data registers;
    comparing the read data registers with the read complementary data registers during the power on sequence; and
    when the comparison determines a mismatch, repeating the loading of the nonvolatile memory data to the set of read data registers and repeating the loading of the nonvolatile memory complementary data to the set of read complementary data registers.

12. The method according to claim 11, further comprising:
    when the comparison determines a match, loading a next set of nonvolatile memory data to a next set of a read data registers and loading a next set of nonvolatile memory complementary data to a next set of read complementary data registers.

13. The method according to claim 11, wherein the power on sequence is performed after the device voltage reaches a predetermined minimum voltage.

14. The method according to claim 11, wherein the loading of the nonvolatile memory data to the set of read data registers and the loading of the nonvolatile memory complementary data to the set of read complementary data registers is performed simultaneously.

15. The method according to claim 11, wherein the loading of the nonvolatile memory data to the set of read data registers and the loading of the nonvolatile memory complementary data to the set of read complementary data registers is performed separately.

* * * * *